(12) United States Patent
Chao et al.

(10) Patent No.: US 6,172,411 B1
(45) Date of Patent: Jan. 9, 2001

(54) SELF-ALIGNED CONTACT STRUCTURES USING HIGH SELECTIVITY ETCHING

(75) Inventors: Li-chih Chao, Yang-mei; Jhon-Jhy Liaw, Sang Chorng; Yuan-Chang Huang; Jin-Yuan Lee, both of Hsin-Chu, all of (TW)

(73) Assignee: Taiwan Semiconductor Manufacturing Company, Hsin-chu (TW)

( * ) Notice: Under 35 U.S.C. 154(b), the term of this patent shall be extended for 0 days.

(21) Appl. No.: 09/208,921

(22) Filed: Dec. 10, 1998

Related U.S. Application Data

(62) Division of application No. 09/005,568, filed on Jan. 12, 1998, now Pat. No. 5,872,063.

(51) Int. Cl.⁷ .................................................. H01L 27/088
(52) U.S. Cl. ........................................... 257/639; 257/900
(58) Field of Search ..................................... 257/639, 649, 257/638, 637, 900; 438/762, 738, 769

(56) References Cited

U.S. PATENT DOCUMENTS

| | | | |
|---|---|---|---|
| 4,455,737 | 6/1984 | Godejahn, Jr. .......................... | 29/571 |
| 4,954,867 | 9/1990 | Hosaka ................................... | 357/52 |
| 5,286,667 | 2/1994 | Lin et al. ............................... | 437/52 |
| 5,364,804 | 11/1994 | Ho et al. ............................... | 437/41 |
| 5,488,246 * | 1/1996 | Hayashide et al. .................... | 257/336 |
| 5,696,036 * | 12/1997 | Su et al. ................................ | 438/239 |
| 5,780,338 * | 7/1998 | Jeng et al. ............................. | 438/253 |
| 5,869,403 * | 2/1999 | Becker et al. ......................... | 438/738 |
| 5,930,627 * | 9/1999 | Zhou et al. ............................ | 438/257 |
| 5,948,701 * | 9/1999 | Chooi et al. ........................... | 438/694 |
| 6,027,971 * | 2/2000 | Cho et al. .............................. | 438/257 |
| 6,060,766 * | 5/2000 | Mehta et al. .......................... | 257/639 |

FOREIGN PATENT DOCUMENTS 0 259 826 * 3/1988 (EP) ..................................... 257/639

* cited by examiner

Primary Examiner—David Hardy
(74) Attorney, Agent, or Firm—George O. Saile; Stephen B. Ackerman; Larry J. Prescott

(57) ABSTRACT

A self-aligned structure and method of etching contact holes in the self-aligned structure are described. The dielectric materials, etching methods, and etchants are chosen to provide high selectivity etching. The structure comprises an electrode with a silicon oxy-nitride cap and silicon oxy-nitride spacers on the sidewalls of the electrode and the cap. An etch stop layer of silicon nitride is deposited over the substrate covering the spacers and cap. A layer of silicon oxide is deposited over the etch stop layer. Etching methods and etchants are used which provide a ratio of the etching rate of silicon oxide to the etching rate of silicon nitride or silicon oxy-nitride of at least eight and a ratio of the etching rate of silicon nitride to the etching rate of silicon oxy-nitride of at least two.

6 Claims, 3 Drawing Sheets

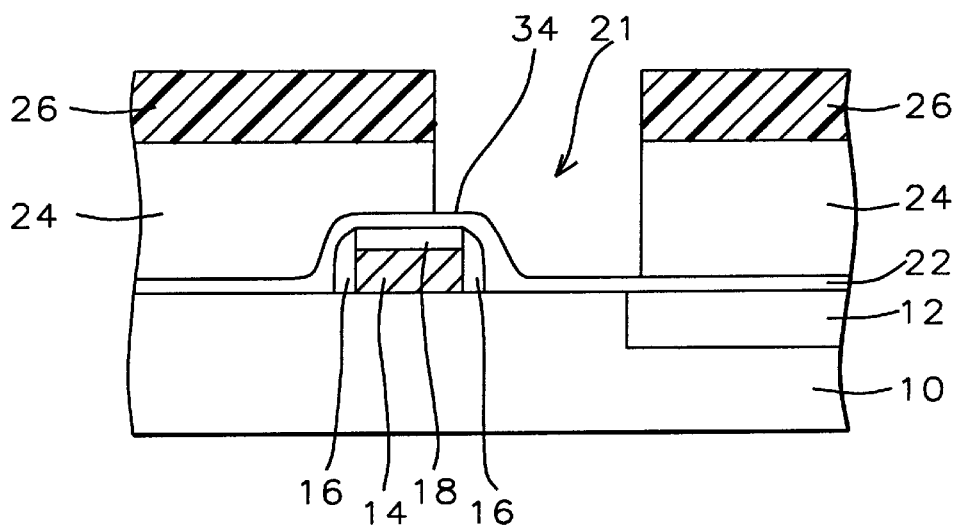
FIG. 1 – Prior Art
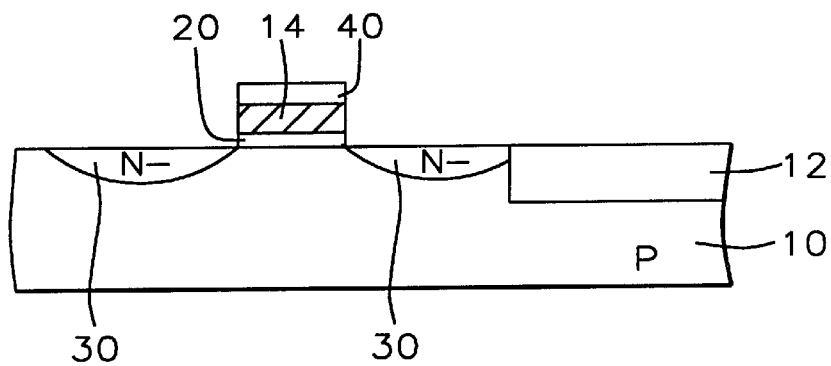
FIG. 2
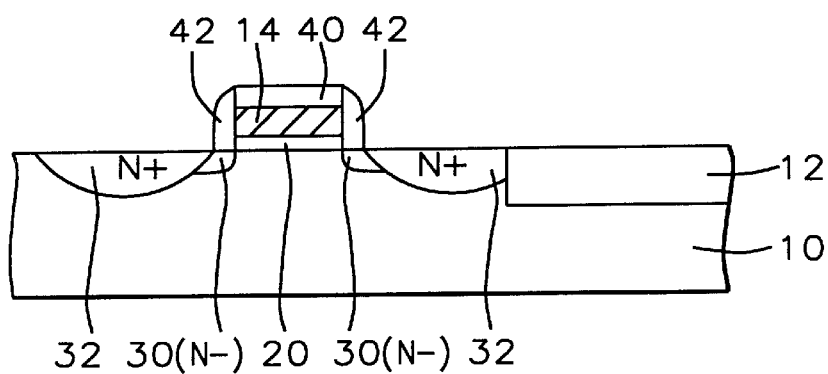
FIG. 3

SELF-ALIGNED CONTACT STRUCTURES USING HIGH SELECTIVITY ETCHING

This is a division of patent application Ser. No. 09/005,568, filing date Jan. 12, 1998, now U.S. Pat. No. 5,872,063, Novel Self-Aligned Contact Structures Using High Selectivity Etching, assigned to the same assignee as the present invention.

BACKGROUND OF THE INVENTION (1) Field of the Invention

This invention relates to a high selectivity etching method for use in forming contact holes in self-aligned contact structures. More particularly the invention relates to selecting dielectrics, etching methods, and etchants to achieve high selectivity etching.

(2) Description of the Related Art

U.S. Pat. No. 4,954,867 to Hosaka describes the use of a layer of silicon oxy-nitride to protect the gate electrode and wirings from oxidation during high temperature processing steps. The invention does not describe the use of highly selective etching methods.

U.S. Pat. No. 5,286,667 to Lin et al. describes the use of silicon nitride or silicon oxy-nitride barrier layers in the fabrication of metal oxide semiconductor field effect transistors. The barrier layer aids endpoint detection for a plasma etch. The invention does not describe the use of highly selective etching methods.

U.S. Pat. No. 5,364,804 to Ho et al. describes a method of forming a self-aligned contact. The method uses tow silicon nitride layers but does not the use of highly selective etching methods.

U.S. Pat. No. 4,455,737 to Godejahn, Jr. describes a method of forming self-aligned gates and contacts for FET devices wherein mask alignment tolerances are increased and rendered non-critical.

SUMMARY OF THE INVENTION

The fabrication of semiconductor integrated circuits frequently requires the use of high selectivity etching for process steps such as etching contact holes during the formation of a self-aligned contact structure. Problems can be encountered in steps such as the etching of contact holes in the formation of a self-aligned contact structure, as will be described with reference to FIG. 1. FIG. 1 shows an electrode 14 formed on a substrate 10 having devices, not shown, and an isolation region 12 formed therein. The isolation region can be a region such as a shallow trench isolation, as shown in FIG. 1, or a field oxide region. A hard mask cap 18 of an oxide, such as silicon oxide, is formed on the electrode 14 and silicon oxide spacers 16 are formed on the sidewalls of the electrode 14 and the oxide cap 18. A silicon nitride liner 22 is formed over the substrate 10 covering the hard mask cap 18 and silicon oxide spacers 16. The spacers 16 are part of a self-aligned contact structure used for forming device regions, not shown in FIG. 1.

An oxide layer 24 is then formed over the silicon nitride liner 22 and a layer of photoresist 26 is formed over the oxide layer 24. The layer of photoresist 26 is patterned to form a contact hole 21 which is typically formed using dry anisotropic etching with the silicon liner 22 acting as an etch stop and providing protection for the silicon oxide spacers 16, the oxide cap 18, and the shallow trench isolation region 12 or field isolation region. Frequently the edge 34 of the silicon nitride liner 22 at the point where the liner 22 passes over the junction between the oxide cap 18 and one of the silicon oxide spacers 16 is very thin allowing the etching to punch through the liner during the etching of the contact hole 21. The punch through of the silicon nitride liner allows the contact hole etching to attack the oxide cap 18 and the silicon oxide spacers 16.

One method of protecting against attack of the spacers 16 and hard mask cap 18 during the contact hole etching is to form the spacers 16 and hard mask cap 18 from silicon nitride. The silicon nitride liner 22 then covers a silicon nitride cap 18 and silicon nitride spacers 16. This protects the silicon nitride cap 18 and silicon nitride spacers 16 from attack due to the problems of punch through of the silicon nitride liner 22 during the contact hole 21 etching but leads to the problem of attack of the silicon nitride cap 18 and the silicon nitride spacers 16 during the removal of the silicon nitride liner 22 when the contact hole 21 is completed.

It is a principle objective of this invention to provide a method of contact hole etching having sufficient etching selectivity to protect the dielectric cap on the electrode and the dielectric spacers on the sidewalls of the electrode in a self-aligned contact structure.

It is another principle objective of this invention to provide a self-aligned contact structure comprising an electrode, a dielectric cap on the electrode, and dielectric spacers on the sidewalls of the electrode which will not be attacked during contact hole etching.

These objectives are accomplished by forming the dielectric cap on the electrode and the dielectric spacers on the sidewalls of the electrode from silicon oxy-nitride. A layer of silicon nitride is then formed over the substrate covering the silicon oxy-nitride cap and silicon oxy-nitride spacers with silicon nitride liner. The contact hole is then etched using an etching means and etchant which has a much greater etch rate for oxide than for silicon nitride or for silicon oxy-nitride. The silicon nitride liner is then removed using an etching means and etchant which has a much greater etch rate for silicon nitride than for silicon oxy-nitride.

BRIEF DESCRIPTION OF THE DRAWINGS

FIG. 1 shows a cross section view of a prior art self-aligned contact structure and contact hole formed in the oxide and photoresist.

FIG. 2 shows a cross section view of a semiconductor substrate after an electrode, insulating dielectric, cap dielectric, and shallow trench isolation have been formed and formation of the source and drain regions has begun.

FIG. 3 shows a cross section view of the semiconductor substrate after the dielectric spacers have been formed and the source and drain regions have been completed.

DESCRIPTION OF THE PREFERRED EMBODIMENTS

Figure 4:
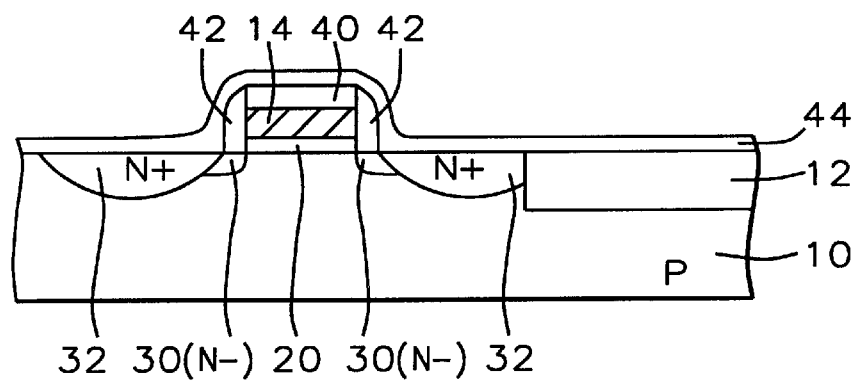
FIG. 4 shows a cross section view of the semiconductor substrate after a layer of dielectric has been formed to form a liner over the substrate covering the cap dielectric and dielectric spacers.

Refer now to FIGS. 2–7 for a description of the preferred embodiment of the method of this invention for etching a contact hole in a self-aligned contact structure. FIG. 2 shows a substrate 10, in this example a P type silicon substrate, having a conducting electrode 14, in this example a gate electrode, formed thereon. An insulating dielectric 20, in this example a gate dielectric of silicon dioxide, is formed between the gate electrode 14 and the substrate 10. A first dielectric cap 40 is formed on the electrode 14. A shallow trench isolation region 12 is formed in the substrate 10 for device isolation. Although this example uses shallow trench isolation for device isolation those skilled in the art will readily recognize that a field oxide isolation can also be used. Using the first dielectric cap 40 and the electrode as a mask the source/drain regions 30 are lightly doped using standard methods forming $N^-$ source/drain regions 30.

Next, as shown in FIG. 3, spacers 42, also formed of first dielectric material, are formed on the sidewalls of the electrode 14 and first dielectric cap 40. The first dielectric spacers 42 are formed using standard methods of depositing a layer of first dielectric and etching back the layer of first dielectric using dry anisotropic etching thereby leaving first dielectric material on the sidewalls of the electrode and the first dielectric cap. Using the first dielectric spacers 42 as a mask that part of the source/drain regions not covered by the first dielectric spacers 42 are heavily doped using standard methods forming $N^+$ source/drain regions 42 and lightly doped, $N^-$, source/drain regions 30 under the first dielectric spacers 42. As shown in FIG. 4 a layer of second dielectric 44 is then formed on the substrate covering the first dielectric cap 40 and the first dielectric spacers.

Figure 5:
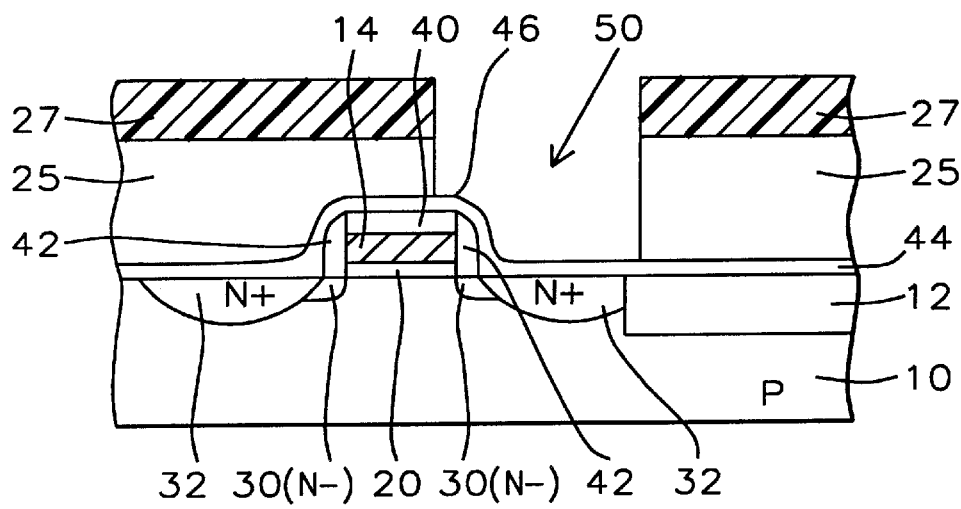
FIG. 5 shows a cross section view of the semiconductor wafer after a layer of oxide has been formed on the semiconductor substrate, a layer of photoresist has been formed on the layer of oxide, and the contact hole has been etched to the dielectric liner.

Next, as shown in FIG. 5, a layer of third dielectric 25 is deposited on the substrate. A layer of resist 27 is formed on the layer of third dielectric 25, exposed and developed to form a resist mask to be used in forming a contact hole 50 in the layer of third dielectric 25. The contact hole 50 is then etched in the layer of third dielectric 25 using the resist mask, the layer of second dielectric 44 as an etch stop, a first etching method, and a first etchant.

The key to this invention is choosing the etching methods, the etchants, and the first, second, and third dielectrics. The second dielectric, the third dielectric, the first etching method, and the first etchant are chosen so that the ratio of the etching rate of the third dielectric to the etching rate of the first dielectric or the second dielectric is at least eight. In this way the contact hole 50 can be formed without damage to the layer of second dielectric 44, the first dielectric cap 40, or the first dielectric spacers 42 especially at the critical point 46 where the first dielectric spacer 42 contacts the first dielectric cap 40.

In this example the first dielectric 40 and 42 is silicon oxy-nitride, SiON; the layer of second dielectric 44 is a layer of silicon nitride, SiN, having a thickness of between about 100 and 800 Angstroms; and the layer of third dielectric 25 is a layer of silicon oxide having a thickness of between about 1000 and 20,000 Angstroms. The silicon oxy-nitride, silicon nitride, and silicon oxide are deposited using chemical vapor deposition. In this example the first etching method is dry anisotropic etching using a source power of between about 1200 watts and 1600 watts and a bias power of between about 1200 watts and 1600 watts. The first etchant in this example comprises $C_4F_8$ at a flow rate of between about 10 and 15 sccm or standard cubic centimeters per minute, $CH_3F$ at a flow rate of between about 5 and 15 sccm, and Ar at a flow rate of between about 50 and 100 sccm. Using this etching method and etchant the etching rate for silicon oxide is about 7000 Angstroms per minute and the etching rate for silicon nitride or silicon oxy-nitride is less than 800 Angstroms per minute so that the ratio of the etching rate of the third dielectric to the etching rate for the first or the second dielectric is greater than 8.75. The patterned layer of photoresist 27 is then removed using an oxygen plasma.

Figure 6:
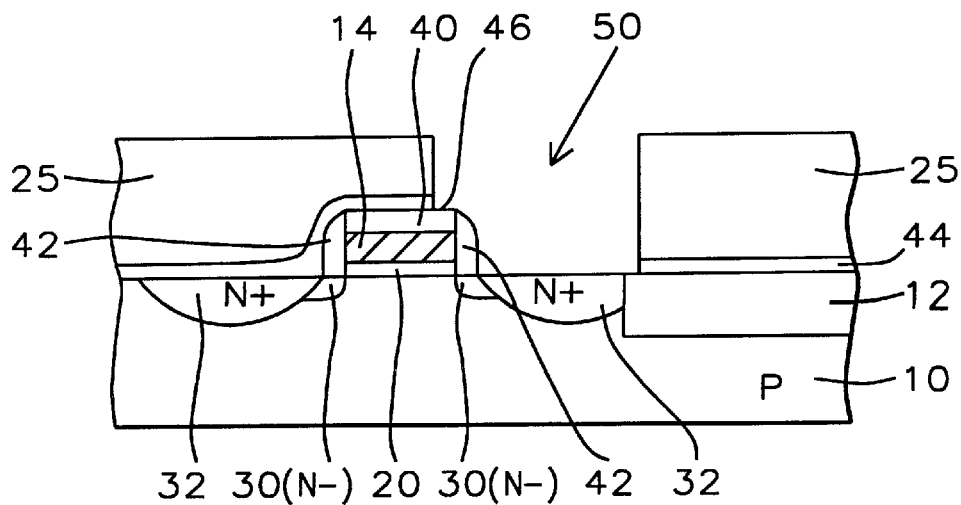
FIG. 6 shows a cross section view of the semiconductor wafer after the contact hole has been etched through the dielectric liner and the photoresist has been removed.

Next, as shown in FIG. 6, that part of the layer of second dielectric at the bottom of the contact hole 50 is etched away using a second etching method and second etchant. The second dielectric, the first dielectric, the second etching method, and the second etchant are chosen such that the ratio of the etching rate of the second dielectric to the etching rate of the first dielectric is at least two. This prevents damage to the first dielectric spacers when that part of the second dielectric in the contact hole is removed. The contact hole formed in the layer of third dielectric 25 serves as a mask in etching the contact hole in the thinner layer of second dielectric 44 during the second etching method.

Figure 7:
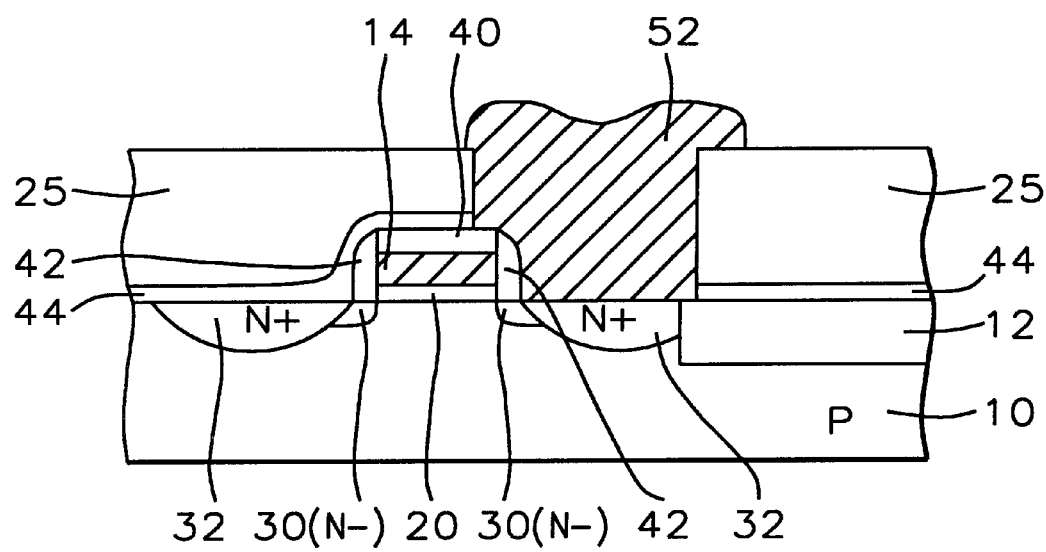
FIG. 7 shows a cross section view of the semiconductor wafer after the contact hole has been filled with conductor material.

In this example, as indicated above, the first dielectric is silicon oxy-nitride, SiON, and the second dielectric is silicon nitride. The silicon oxy-nitride and silicon nitride are deposited using chemical vapor deposition. The second etching method is dry anisotropic etching using a source power of between about 1800 and 2200 watts and a bias power of between about 100 and 300 watts. The second etchant comprises $CH_3F$ at a flow rate of between about 10 and 20 sccm, $O_2$ at a flow rate of between about 5 and 20 sccm, and Ar at a flow rate of between about 50 and 100 sccm. Using this etching method and etchant the etching rate for silicon nitride is about 1940 Angstroms per minute and the etching rate for silicon oxy-nitride is about 800 Angstroms per minute so that the ratio of the etching rate of the second dielectric to the etching rate for the first dielectric is about 2.42. Next, as shown in FIG. 7, the contact hole is filled with conducting material 52.

In this example the silicon substrate is P type silicon, the source/drain regions are $N^+$ type silicon, and the lightly doped source/drain regions are $N^-$ type silicon. Those skilled in the art will readily recognize that the method of this invention will work equally well using an N type silicon substrate, $P^+$ type source/drain regions, and $P^-$ type lightly doped source/drain regions. Those skilled in the art will also readily recognize that the method of this invention does not depend on the type of substrate material used and will work with other type substrates.

The choice of etching methods, etchants, and dielectrics provides needed etching selectivity to prevent damage to the dielectric spacers or dielectric cap on the electrode. In this example the first dielectric cap 40 on the electrode and the first dielectric spacers 42 are silicon oxy-nitride, SiON. The layer of second dielectric 44 used as an etching stop layer is silicon nitride, SiN. The layer of third dielectric 25 is silicon oxide.

While the invention has been particularly shown and described with reference to the preferred embodiments thereof, it will be understood by those skilled in the art that various changes in form and details may be made without departing from the spirit and scope of the invention.

What is claimed is:

1. A contact structure, comprising:
   a substrate having devices formed therein and an electrode formed thereon, wherein said electrode has a top and sidewalls;

a silicon oxy-nitride cap formed on said top of said electrode, wherein said silicon oxy-nitride cap has sidewalls;

silicon oxy-nitride spacers formed on said sidewalls of said electrode and said sidewalls of said silicon oxy-nitride cap;

a layer of silicon nitride formed on said substrate thereby covering said silicon oxy-nitride cap and said silicon oxy-nitride spacers, and in contact with said silicon oxy-nitride cap and at least one of said silicon oxy-nitride spacers;

a layer of dielectric on said layer of silicon nitride; and a contact hole formed in said layer of dielectric and said layer of silicon nitride.

2. The contact structure of claim 1 wherein said layer of silicon nitride has a thickness of between about 100 and 800 Angstroms.

3. The contact structure of claim 1 wherein said layer of dielectric is silicon oxide having a thickness of between about 1000 and 20,000 Angstroms.

4. The contact structure of claim 1 wherein a silicon oxide insulator is formed between said electrode and said substrate, said silicon oxide insulator has sidewalls, and said silicon oxy-nitride spacers are also formed on said sidewalls of said silicon oxide insulator.

5. The contact structure of claim 1 wherein said substrate is a silicon substrate.

6. The contact structure of claim 1 wherein said electrode is a polysilicon electrode.

* * * * *